United States Patent [19]

Brown

[11] 4,110,585

[45] Aug. 29, 1978

[54] GROUNDED LEVER TOGGLE SWITCH

[75] Inventor: Harry W. Brown, Big Bend, Wis.

[73] Assignee: Cutler-Hammer, Inc., Milwaukee, Wis.

[21] Appl. No.: 789,546

[22] Filed: Apr. 21, 1977

[51] Int. Cl.² .......................................... H01H 21/22
[52] U.S. Cl. ................................................. 200/305
[58] Field of Search .......... 200/302, 304, 305, 153 G, 200/329, 334, 335; 174/35 C

[56] References Cited

U.S. PATENT DOCUMENTS 3,566,064  2/1971  Neillis ................................. 200/305
3,601,568  8/1971  Sorenson ............................. 200/304

Primary Examiner—Jerry W. Myracle
Attorney, Agent, or Firm—Hugh R. Rather; William A. Autio; Michael E. Taken

[57] ABSTRACT

EMI (electromagnetic interference) is prevented by grounding the switch operator. This is done by placing an electrically conductive spring brush within the switch housing to connect the toggle lever to the metal frame of the switch. Since the metal frame is connected through its mounting panel to ground, the toggle lever becomes grounded to prevent EMI.

12 Claims, 5 Drawing Figures

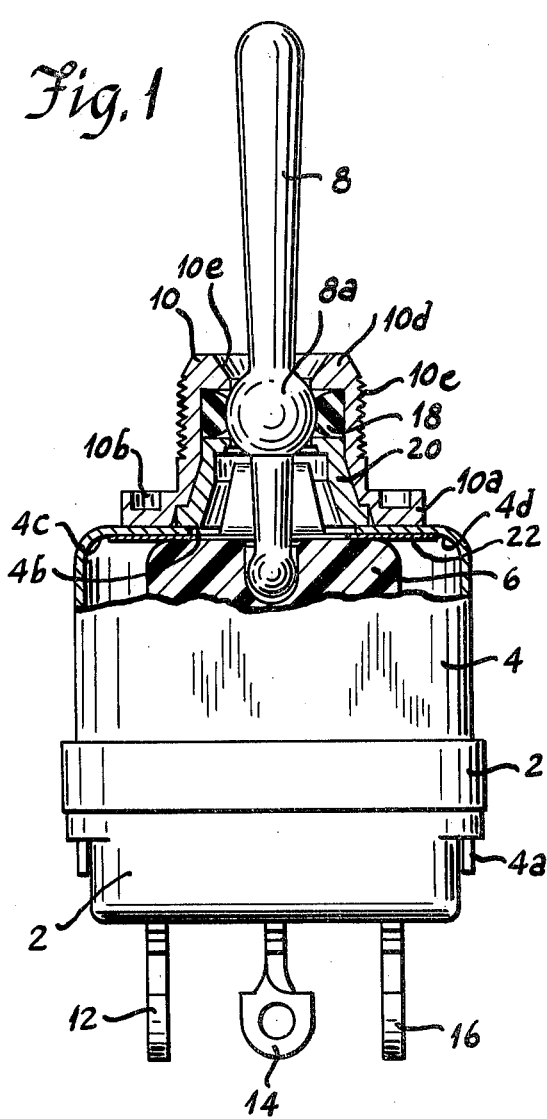
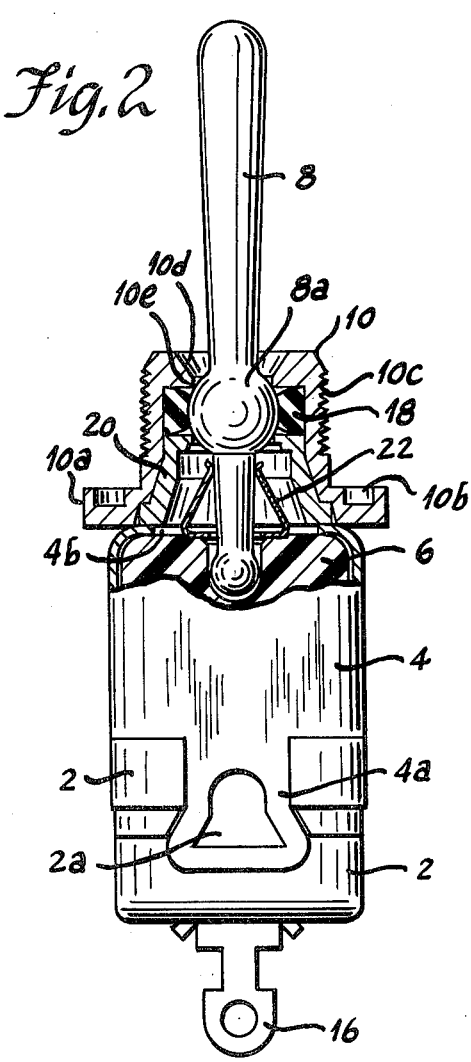
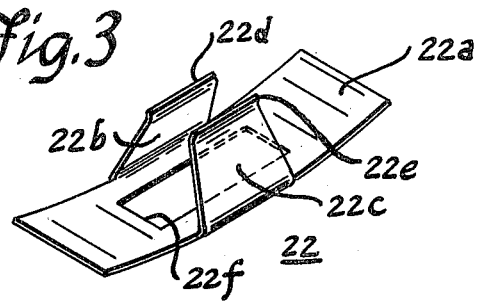

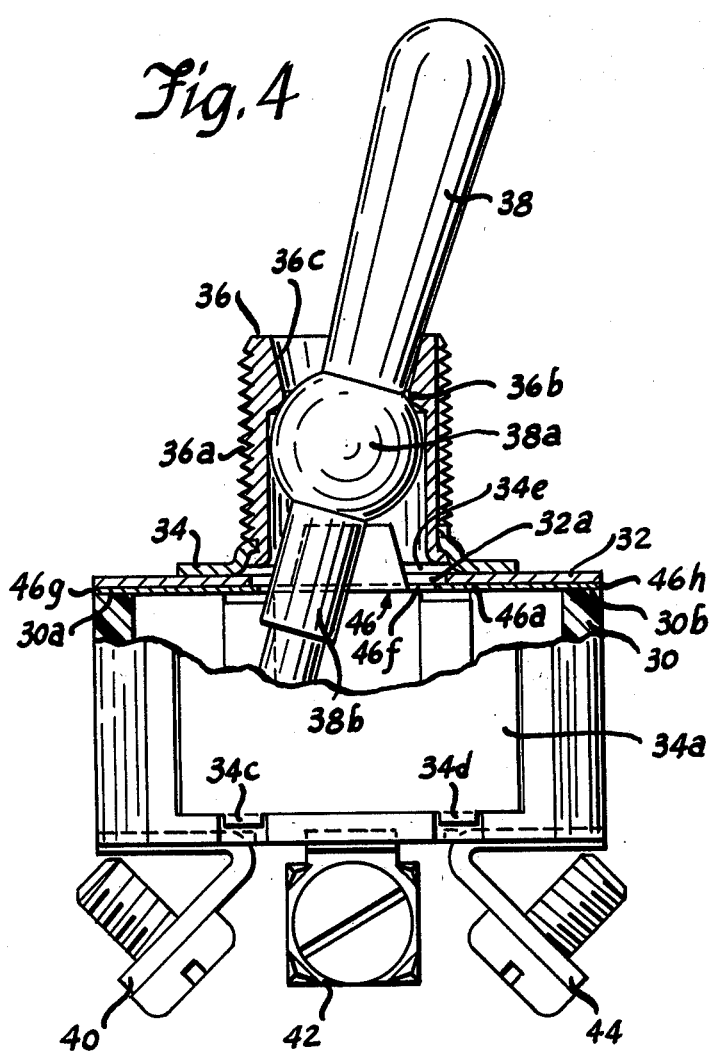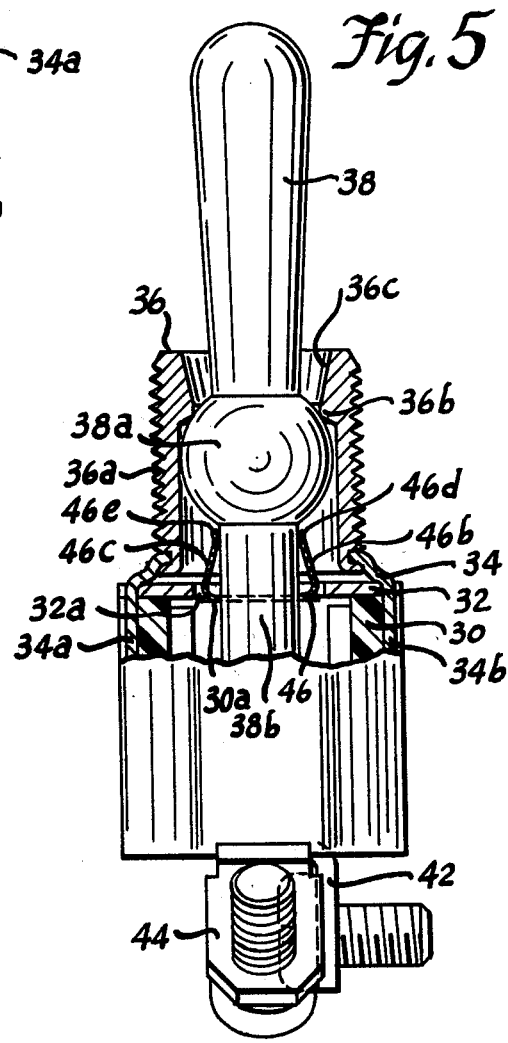

4,110,585

GROUNDED LEVER TOGGLE SWITCH

BACKGROUND OF THE INVENTION

Grounding the toggle lever of a switch to prevent EMI has been known heretofore. For example, H. W. Hults U.S. Pat. No. 3,959,617, dated May 25, 1976, and assigned to the assignee of this invention, discloses use of a conductive lubricant between the toggle lever and its pivot pin to insure an electrical connection through such pin, the metal switch frame and mounting panel to ground. H. W. Hults application Ser. No. 664,309, filed Mar. 5, 1976, which is a continuation of Ser. No. 541,095, filed Jan. 15, 1975, now abandoned, discloses use of an electrically conductive elastomer seal between the toggle lever and the bushing and pivot pin to ground the lever and thus prevent electromagnetic radiation. W. B. Halbeck application Ser. No. 736,391, filed Oct. 28, 1976, discloses the use of an electrically conductive elastomeric coating on a toggle lever seal that provides the grounding connection without excessively impeding toggle lever movement. The aforementioned applications are assigned to the assignee of this invention. It has also been known to rivet a metal plate to the internal surface of the frame of a toggle switch, such plate having a central hole providing clearance for toggle lever movement and a pair of tabs bent up from opposite edges of such hole, that is, from the inner edges of the plate, to contact the toggle lever. Because these tabs have limited length, it is necessary to place a bushing on the toggle lever to enlarge its diameter so that the tabs will reach it for sliding engagement. However, because these tabs are limited to a very short length by the material available at the center of the plate, their resiliency is also severely limited which makes it difficult to insure a reliable electrical connection.

While these prior devices have been useful for their intended purposes, this invention relates to improvements thereover.

SUMMARY OF THE INVENTION

An object of the invention is to provide an electric switch with improved operator grounding means to prevent electromagnetic radiation therefrom.

A more specific object of the invention is to provide an electric switch with improved one-piece grounding means for the operator.

Another specific object of the invention is to provide an electric switch with an improved one-piece grounding member for the operating lever that can be added in assembly without any modification of the switch.

Another specific object of the invention is to provide an electric switch with an improved one-piece grounding member of the aforementioned type that is constructed to insure good electrical contact to both the operating lever and the switch housing.

Another specific object of the invention is to provide an improved one-piece grounding element that is especially applicable to a toggle switch for electrically connecting the toggle lever to the switch frame.

Another specific object of the invention is to provide a toggle switch with a one-piece lever grounding brush that is easy and economical to assemble with little or no modification of the switch structure.

Other objects and advantages of the invention will hereinafter appear.

BRIEF DESCRIPTION OF THE DRAWINGS

FIG. 1 is an enlarged front elevational view, partly in section, of a miniature toggle switch showing the grounding member (or brush) in longitudinal section;

FIG. 2 is an end elevational view, partly in section, of the switch of FIG. 1 showing the grounding brush in lateral section;

FIG. 3 is an isometric view of the grounding brush used in the switch of FIGS. 1 and 2.

FIG. 4 is an enlarged front elevational view, partly in section, of a different version of a toggle switch showing the grounding member (or brush in longitudinal section with its ends clamped between the base and frame; and FIG. 5 is a right-end elevational view, partly in section, of the switch of FIG. 4 showing the grounding brush in lateral section.

DESCRIPTION OF THE PREFERRED EMBODIMENT

Referring to FIGS. 1 and 2, there is shown a miniature toggle switch incorporating a grounding member in accordance with the invention. This miniature switch may be as small as 9/16 inch wide, 13/32 inch deep and 1 3/16 inch high inclusive of the terminals at the bottom and the toggle lever at the top. While a single-pole double-throw switch having three terminals has been shown, it will be apparent that the invention is equally applicable to switches having different numbers of poles of either single-throw or double-throw type.

The switch as shown in FIGS. 1 and 2 is provided with a housing including an electrically insulating base 2 having an open top that is closed by a metal frame or cover 4 and secured thereto by apertured tabs 4a that fit over lugs 2a at opposite ends of the base as shown in FIG. 2 to provide a compartment therewithin for the switch mechanism. This switch mechanism includes a drive plate 6 shown partly in FIGS. 1 and 2 that is driven in opposite directions from its center off position by toggle lever 8 to close either set of contacts. For a more detailed disclosure of the switch operating mechanism including the toggle lever, drive plate, actuator block, detent plunger and springs, actuating lever, spring and movable and stationary contacts, reference may be had to H. W. Hults U.S. Pat. No. 3,636,286 dated Jan. 18, 1972, and assigned to the assignee of this invention.

The aforementioned switch frame 4 is provided with a bushing 10 through which extends the operating handle of an operating lever or toggle lever 8. Three spaced-apart terminals 12, 14 and 16 extend out through the bottom of the base and are adapted for connecting the respective stationary contacts of the switch to an external circuit. Bushing 10 is provided with a flange 10a at its lower end secured to the upper surface of the frame as by welding to center the bushing on the frame, this frame having a center aperture 4b leading into the bushing bore. The upper peripheral portion of this flange is provided with a circular channel 10b adapted to receive an O-ring to seal the switch to a panel on which it is one-hole mounted. For this purpose, the bushing is provided with external threads 10c to receive a nut (not shown) to mount the switch by its bushing in a hole in the mounting panel.

The operating lever is mounted for pivotal movement in the bushing and is sealed. For this purpose, the bushing is provided at its upper portion with an internal flange 10d against which the upper side of the spherical portion 8a of the operating lever bears when the handle is inserted through the bushing bore from below. An annular seal 18 surrounds the spherical portion of the operating lever and a retaining bushing 20 compresses the seal between itself and the bushing including its internal flange 10d and the spherical portion of the operating lever to provide a lever seal. This retaining bushing 20 is frusto-conically shaped so that it diverges downwardly to allow space for the lower end portion of the operating lever to swing from one side to the other when the switch is operated. Internal flange 10d at the upper end of the bushing is also provided with a bevel 10e to provide clearance for such swinging movement of the operating handle portion of the toggle lever.

In this type of switch, drive plate 6 is resiliently biased upwardly against the internal surface of frame 4 around aperture 4b. As the toggle lever handle is swung to the right in FIG. 1, drive plate 6 slides toward the left to close contacts connecting terminals 12 and 14. And as the toggle lever handle is swung to the left, drive plate 6 slides toward the right to close contacts connecting terminals 14 and 16.

To insure that there will always be a good electrical connection from the toggle lever to ground through the frame, bushing and its mounting plate, the switch is provided with a simple, effective and economical grounding means. Toggle switches have had the disadvantage in certain applications of EMI radiation due to the antenna effect of the toggle lever. This is undesirable because it has a tendency to interfere with other electrical equipment. Grounding the toggle lever would prevent it.

For this purpose, there is provided a one-piece, formed, connector member or brush 22 shown in FIG. 3. This brush is a spring-like member made of phosphor-bronze, berylium-copper or equivalent. As shown in FIG. 3, this connector brush is cut from a thin sheet of the aforementioned material to provide a generally rectangular body portion 22a having a pair of lateral wings 22b and 22c extending from the center of the two opposite outer side edges thereof and bent upwardly and inwardly so that their upper tips 22d and 22e are spaced apart initially less than the diameter of the toggle lever at the point where they will grip the latter. Also, these tips 22d and 22e are provided with a small outward curvature to provide sufficient radius so that the sharp horizontal corners along these tips do not bite into the toggle lever to avoid excessive wear while making a good, sliding, electrical contact. This brush 22 is also provided with a rectangular aperture 22f symmetrically located on its rectangular body portion 22a to provide clearance for swinging of the toggle lever therein. Furthermore, the rectangular body portion 22a is longitudinally bowed so that its ends curve slightly upwardly to provide self-bias for good electrical contact with the internal surface of the switch frame. Moreover, this body portion 22a is designed to be a little shorter than the space it fits into as shown in FIG. 1, leaving clearances 4c and 4d within the frame at opposite ends thereof. This assures some sliding action of brush 22 back and forth as the toggle lever is moved in opposite directions. This sliding action serves to maintain a clean, low resistance contact of the brush to the frame for a long period of time. As shown in FIG. 1, when this grounding element is assembled in the switch between drive plate 6 and the switch frame, the upward bias of the drive plate, provided by the contact spring such as shown in the aforementioned H. W. Hults patent, flattens the bowed grounding element 22 against the internal surface of the switch frame. As a result, the self-bias causes the ends of body portion 22a to be pressed tightly against the switch frame for good electrical contacts. Also arms 22b and 22c are spread apart enough to receive the toggle lever between the tips thereof. The self-bias of these long arms provides contact pressure to the toggle lever. In this manner, the toggle lever is reliably connected through this brush, frame and bushing to the mounting panel and therethrough to ground to avoid any electromagnetic radiation therefrom.

When the toggle lever is swung left or right to operate the switch, the lower end portion of this toggle lever immediately below spherical portion 8a thereof slides between tips 22d and 22e of grounding brush 22 to maintain good electrical contact therebetween and brush 22 slides a small amount on the frame. As shown in FIG. 3, since arms 22b and 22c are formed and bent upwardly from the outer edges of body portion 22, they can be given any desired length. As shown in FIG. 2, these arms are preferably given a length so that their tips engage the toggle lever very close to its pivot, that is, immediately below spherical portion 8a. This is necessary to provide just enough sliding movement between the toggle lever and grounding brush 22 and between the brush and the frame to keep the electrical connection therebetween clean but not so much as to cause excessive wear of the parts. Moreover, arms 22b and 22c must be given maximum length to afford the necessary resiliency and sufficient bias to insure tight gripping of the toggle lever and sufficient wear allowance over a long period of use.

FIGS. 4 and 5 show the grounding brush applied to a different version of a toggle switch, that is, a standard size toggle switch of the three-position type.

This switch is provided with a housing including an electrically insulating base 30 having an open top that is closed by a metal frame including a metal cover 32 and a frame clamp 34. This metal cover is clamped to the top of the base by a metal frame clamp 34 having like skirts 34a and 34b extending down along shallow recesses on the front and back of the base and each terminating in a pair of tabs such as tabs 34c and 34d in FIG. 1 that are clinched into undercut notches at the bottom of the base. Cover 32 has a central hole 32a leading into a superimposed central hole 34e in frame clamp 34 and into the hole in bushing 36. This bushing is attached to the rim of the hole in frame clamp 34, this rim being upwardly offset to provide clearance for forming the lower end of the bushing therebelow.

The aforementioned base and cover provide a compartment for the switch contacts. While these contacts are not shown, they may be similar to the contacts shown in H. W. Hults U.S. Pat. No. 2,744,984, dated May 8, 1956, or R. E. Larkin U.S. Pat. No. 2,936,347, dated May 10, 1960, and assigned to the Assignee of this invention.

This switch is also provided with an operating lever, or toggle lever 38, that extends from the contact compartment out through bushing 36 and is adapted to operate the switch contacts so as to establish selective connections between terminals 40, 42 and 44.

Bushing 36 is provided with external threads 36a to receive a nut (not shown) to mount the switch in a hole in a mounting panel.

Toggle lever 38 is mounted for pivotal movement in the bushing. For this purpose, the bushing is provided at its upper portion with an internal flange 36b against which the upper side of the spherical portion 38a of the toggle lever bears when the handle is inserted through the bushing bore from below. Internal flange 36b at the upper end of the bushing is provided with a bevel 36c to provide clearance for the handle portion of the operating lever as it is swung from the middle to one side or the other when the switch is operated.

Grounding brush 46 in FIGS. 4 and 5 is similar to brush 22 in FIGS. 1-3 except that it may be dimensioned to fit this version of switch. Its rectangular body portion 46a extends across the lower surface of cover 32 as shown in FIG. 4. Its upstanding arms 46b and 46c grip the lower portion 38b of the toggle lever directly below pivotal spherical portion 38a as shown in FIG. 5 and the tips 46d and 46e are curved enough to provide a reduced-wear contact with the toggle lever. The central hole 46f in this grounding brush is rectangular as in the first version of switch. Both ends 46g and 46h of this grounding brush are clamped between the base and the cover to provide a good electrical contact to the cover and through the frame clamp and bushing and mounting panel to ground. For this purpose, the upper edges of the end walls of base 30 are provided with shallow recesses 30a and 30b having a depth slightly less than the thickness of the ends 46g and 46h of the grounding brush to provide good contact pressure between the grounding brush and the cover when the frame clamp secures the cover to the base.

While metal cover 32 and metal frame clamp 34 are shown as separate pieces providing a metal frame for closing the base and supporting metal bushing 36, it will be apparent that these metal parts could be one piece with the parts thereof integral or rigidly secured together to constitute a metal frame.

While the apparatus hereinbefore described is effectively adapted to fulfill the objects stated, it is to be understood that the invention is not intended to be confined to the particular preferred embodiments of grounded level toggle switch disclosed, inasmuch as they are susceptible of various modifications without departing from the scope of the appended claims.

I claim:

1. An electric switch comprising:
   a switch housing composed at least partly of metal having an opening therein and normally being grounded in use;
   a switch operating mechanism within said housing;
   a metal switch actuator extending out through said opening so as to be accessible for operation to actuate said operating mechanism;
   means mounting said actuator to said housing to allow selective movement thereof to actuate said operating mechanism;
   and means electrically connecting said actuator to the metal part of said housing to prevent electromagnetic radiation therefrom while allowing relatively unimpeded movement of said actuator comprising:
   an electrically conductive grounding element in contact with the metal part of said housing and having an aperture through which said actuator extends and a pair of arms extending up from the outer edges of said grounding element and toward one another to resiliently grip said switch actuator therebetween for good electrical contact to electrically connect said actuator to said grounded metal part of said housing.

2. The electric switch claimed in claim 1, wherein:
   said electrically conductive grounding element is a one-piece member formed from a thin, flat metal plate and comprises:
   an elongated body portion having said aperture therein;
   and said arms extend laterally from the opposite, outer side edges of said body portion upwardly and toward one another.

3. The electric switch claimed in claim 2, wherein:
   said body portion is bowed so that the opposite end portions thereof curve upwardly to provide good contact pressure when said grounding element is pressed against the metal part of said housing by the switch operating mechanism therewithin;
   and said body portion is a little shorter than the space along the metal part of the housing that it contacts to allow a small amount of sliding action therebetween.

4. The electric switch claimed in claim 2, wherein:
   the opposite ends of said elongated body portion extend between portions of said housing and are clamped therebetween to make good electrical contact to said metal part of said housing.

5. An electric toggle switch comprising:
   a switch housing including an insulating base and a metal frame secured thereto providing a compartment for a switch operating mechanism therewithin, and a metal bushing on said frame;
   said frame being normally grounded through said bushing to its mounting plate;
   a toggle lever extending through said bushing and pivotally supported therein for actuating said operating mechanism;
   said operating mechanism comprising an insulating drive plate resiliently biased up against the upper internal surface of said frame about said bushing and engaged by said toggle lever for reciprocal movement;
   and electrically conductive grounding means connecting said toggle lever to said frame to prevent electromagnetic radiation therefrom while allowing relatively unimpeded pivotal movement of said toggle lever comprising:
   an electrically conductive elongated spring plate having an aperture and a pair of lateral arms extending from opposite outer edges of said plate upwardly and toward one another, said elongated spring plate being clamped between said insulating drive plate and said frame to contact the latter, said toggle lever extending through said aperture, and the upper tips of said lateral arms resiliently gripping said toggle lever near its pivot to provide enough sliding action therebetween for maintaining the contact clean but not so much as to cause excessive wear.

6. The electric toggle switch claimed in claim 5, wherein:
   the tips of said arms are wide enough to maintain contact with said toggle lever as the latter is pivoted from one extreme position to another.

7. The electric toggle switch claimed in claim 6, wherein:
   the tips of said arms are provided with a small radius, outward curvature to prevent the corners thereof from biting into the toggle lever while maintaining good sliding contact therewith.

8. The electric toggle switch claimed in claim 5, wherein:

said elongated spring plate is normally bowed so that its ends curve slightly upwardly for good contact pressure against said frame when it is pressed thereagainst by said insulating drive plate.

9. The electric toggle switch claimed in claim 8, wherein:

said frame provides clearance at opposite ends of said elongated spring plate to allow a small amount of sliding therebetween when said toggle lever is pivotally actuated.

10. The electric toggle switch claimed in claim 5, wherein:

said elongated spring plate is made of a thin plate of phosphor-bronze, berrylium copper, or equivalent spring-like good electrically conductive material.

11. The electric toggle switch claimed in claim 5, wherein:

the opposite ends of said elongated spring plate extend between said insulating base and said metal frame and are clamped therebetween for good electrical connection to said frame.

12. The electric toggle switch claimed in claim 11, wherein:

said insulating base is provided with a pair of opposite shallow recesses having less depth than the thickness of said ends of said elongated spring plate to provide contact pressure between said spring plate and said frame when the latter is secured to said base.

* * * * *